Figure 1:
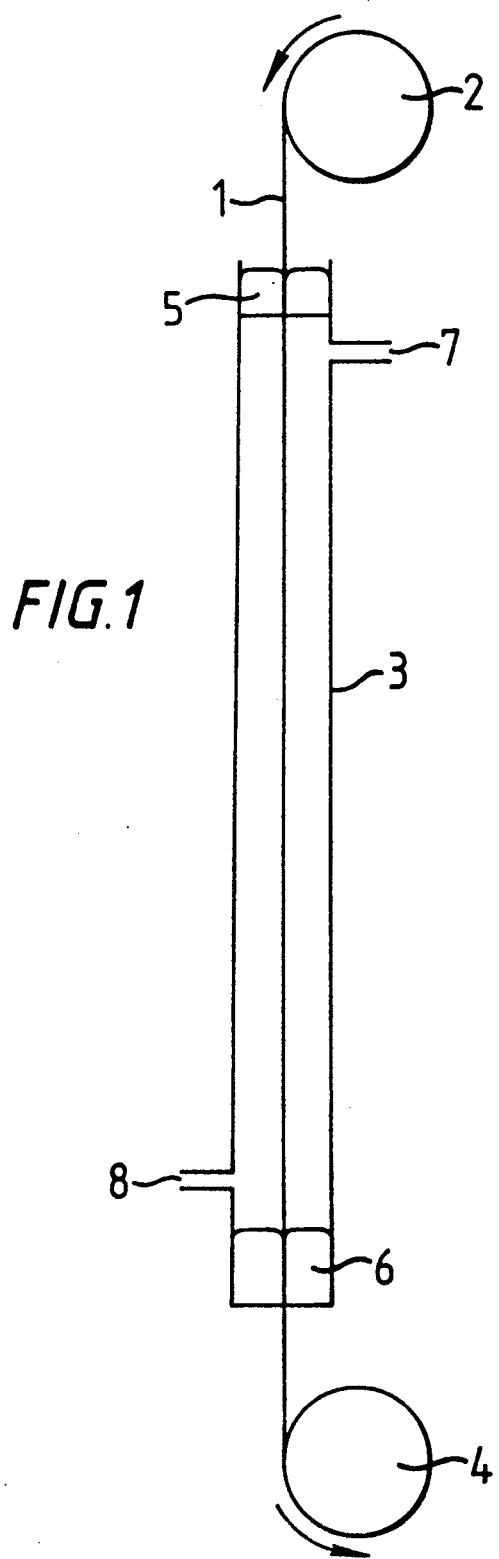

United States Patent [19]

Gruber

[11] Patent Number: 5,041,305
[45] Date of Patent: Aug. 20, 1991

[54] PROCESS FOR DEPOSITING A SILICON CARBIDE COATING ON A FILAMENT

[75] Inventor: Philip Gruber, Tübingen, Fed. Rep. of Germany

[73] Assignee: The British Petroleum Company p.l.c., London

[21] Appl. No.: 514,781

[22] Filed: Apr. 25, 1990

[30] Foreign Application Priority Data

May 4, 1989 [GB] United Kingdom ............... 8910182

[51] Int. Cl.$^5$ .................... C23C 16/32; C23C 16/46; C23C 16/54
[52] U.S. Cl. ........................................ 427/52; 427/49; 427/50; 427/249; 427/255.1; 427/255.2; 427/255.5
[58] Field of Search ............. 427/39, 249, 255.1, 427/255.2, 49, 50, 52, 255.5; 423/439

[56] References Cited

U.S. PATENT DOCUMENTS

| | | | |
|---|---|---|---|
| 3,622,369 | 11/1971 | Basche | 427/249 |
| 3,667,100 | 6/1972 | Marchal et al. | 427/249 |
| 4,315,968 | 2/1982 | Supplinskas et al. | 428/367 |
| 4,596,741 | 6/1986 | Endou et al. | 427/38 |

FOREIGN PATENT DOCUMENTS

| | | |
|---|---|---|
| 1696621 | 11/1971 | Fed. Rep. of Germany. |
| 58-141377 | 8/1983 | Japan. |
| 62-297467 | 12/1987 | Japan ................................ 427/249 |

OTHER PUBLICATIONS

DeBolt et al. "Silicon Carbide–1973", 1974, pp. 168–175.

*Primary Examiner*—Shrive Beck
*Assistant Examiner*—Margaret Burke
*Attorney, Agent, or Firm*—Larry W. Evans; Joseph G. Curatolo; Teresan W. Gilbert

[57] ABSTRACT

A process for depositing a silicon carbide coating on a filament, which comprises heating the filament in a deposition chamber containing a gaseous atmosphere which on contact with the hot filament deposits a coating of silicon carbide; characterized in that the atmosphere in the deposition chamber includes a minor amount of carbon dioxide.

10 Claims, 1 Drawing Sheet

PROCESS FOR DEPOSITING A SILICON CARBIDE COATING ON A FILAMENT

The present invention relates to a process for depositing a silicon carbide coating on a filament.

It is well known to deposit a silicon carbide coating on a filament using chemical vapour deposition techniques. In a typical process, a filament is passed continuously through a deposition chamber. The filament is heated by passage of an electric current, and the silicon carbide coating is deposited from carbon and silicon containing gases in the deposition chamber. Such processes are described in for example U.S. Pat. No. 4127659 and U.S. Pat. No. 3622369.

We have now found that an improved product can be obtained by including a minor amount of carbon dioxide in the atmosphere in the deposition chamber.

A BRIEF DESCRIPTION OF THE DRAWINGS

FIG. 1 shows an apparatus for depositing a silicon carbide coating on a filament.

Accordingly, the present invention provides a process for depositing a silicon carbide coating on a filament, which comprises heating the filament in a deposition chamber containing a gaseous atmosphere which on contact with the hot filament deposits a coating of silicon carbide; characterized in that the atmosphere in the deposition chamber includes a minor amount of carbon dioxide.

The atmosphere in the deposition chamber preferably contains less than 2%, preferably less than 1%, by volume of carbon dioxide. Preferably the atmosphere contains at least 0.05%, preferably at least 0.1%, by volume of carbon dioxide.

The atmosphere in the deposition chamber may contain any of the gases known for production of coatings of silicon carbide. Typical gases include haloalkylsilanes, such as methyltrichlorosilane, methyldichlorosilane or dimethyldichlorosilane, together with hydrogen. A mixture of different haloalkylsilanes and hydrogen may be used. Silicon tetrachloride or monosilane together with a hydrocarbon, for example methane, and hydrogen, may be used. Careful control of the atmosphere is important to ensure a high quality product; in particular, leakage of air into the atmosphere in the deposition chamber is to be avoided. It should be understood that the carbon dioxide present has not been introduced in the form of air.

The silicon carbide may be deposited on any suitable filament, for example a tungsten or carbon filament. It may be deposited as a further coating on a filament already coated with ceramic, for example boron. Depending upon the intended use, one or more further coatings, for example boron or a boron compound, may be deposited on top of the silicon carbide.

Depending on the precise composition of the atmosphere used in the deposition chamber, the silicon carbide deposited may be stoichiometric, silicon-rich or carbon-rich. The composition may vary throughout the thickness of the coating. The microstructure of the coating may also vary. Methods of depositing various such coatings are described in, for example, U.S. Pat. No. 4068037, U.S. Pat. No. 4315968, U.S. Pat. No. 4340636, U.S. Pat. No. 4415609, U.S. Pat. No. 4628002 and U.S. 4702960.

In order to promote efficient deposition, the filament is preferably heated to a temperature in the range of from 700 to 1600° C. preferably 900 to 1100° C. Any suitable form of heating may be used, but preferably the filament is heated resistively by passage of an electric current. The current is most conveniently transmitted by electrodes containing a pool of mercury or mercury amalgam through which the filament passes. Any electrode through which the filament passes after deposition of the silicon carbide preferably contains a mercury/indium amalgam rather than pure mercury. This amalgam preferably contains from 0.5 to 8%, especially 1 to 6%, by weight of indium.

If desired, the process according to the invention may incorporate one or more cleaning steps. The filament may be passed prior to coating through one or more cleaning zones, containing an inert or reducing atmosphere, and heated to remove surface impurities.

The products prepared by the process of the invention are of high quality. In particular, the presence of carbon dioxide in the gaseous atmosphere leads to a product with improved tensile stength.

The process of the invention is illustrated in the accompanying drawing, FIG. 1, which shows an apparatus which may be used to carry out the invention.

A filament 1, for example tungsten, is fed from a supply 2 via a tubs 3 to a store 4. The filament 1 passes through electrodes 5 and 6 at the ends of the tube 3, electrode 5 containing mercury, and electrode 6 containing mercury/indium amalgam. The electrodes 5 and 6 form part of an electric circuit (not shown) which supplies an electric heating current to the filament 1. Gases which on contact with the hot filament deposit a coating of silicon carbide, are fed into the tube 2 via inlet 7, and removed via outlet 8. The gases fed though inlet 7 include a minor amount of carbon dioxide.

I claim:

1. A process for depositing a silicon carbide coating having improved tensile strength on a filament, which comprises resistively heating the filament by passage of an electric current, in a deposition chamber containing a gaseous atmosphere which on contact with the hot filament deposits a coating of silicon carbide; characterized in that the atmosphere in the deposition chamber includes carbon dioxide, the amount of carbon dioxide being in the range of about 0.05% to about 2% by volume of carbon dioxide.

2. A process as claimed in claim 1 in which silicon carbide is deposited on a tungsten or carbon filament.

3. A process as claimed in claim 1 in which the gaseous atmosphere in the deposition chamber comprises a haloalkylsilane or mixture of haloalkylsilanes together with hydrogen.

4. A process as claimed in claim 1, in which silicon carbide is deposited on a tungsten or carbon filament.

5. A process as claimed in claim 1, in which silicon carbide is deposited on a tungsten or carbon filament.

6. A process as claimed in claim 1, in which the gaseous atmosphere in the deposition chamber comprises a haloalkylsilane or mixture of holoalkylsilanes together with hydrogen.

7. A process as claimed in claim 1, in which the gaseous atmosphere in the deposition chamber comprises a haloalkylsilane or mixture of haloalkylsilanes together with hydrogen.

8. A process as claimed in claim 2, in which the gaseous atmosphere in the deposition chamber comprises a haloalkylsilane or mixture of haloalkylsilanes together with hydrogen.

9. A process for depositing a silicon carbide coating having improved tensile strength on a filament, which comprises heating the filament in a deposition chamber containing a gaseous atmosphere which on contact with the hot filament deposits a coating of silicon carbide; characterised in that the atmosphere in the deposition chamber includes in the range of about 0.05% to about 2% by volume of carbon dioxide.

10. A process for depositing a silicon carbide coating on a filament, which comprises heating the filament in a deposition chamber containing a gaseous atmosphere comprising haloalkylsilane or mixtures of haloalkysilanes together with hydrogen and includes less than 2% by volume of carbon dioxide which on contact with a hot filament deposits a coating of silicon carbide.

* * * * *